(12) United States Patent
Nakahara

(10) Patent No.: US 11,021,388 B2
(45) Date of Patent: Jun. 1, 2021

(54) PERFORATED QUARTZ GLASS TUBE AND METHOD FOR MANUFACTURING PERFORATED QUARTZ GLASS TUBE

(71) Applicant: NAKAHARA OPTO-ELECTRONICS LABORATORIES, INC., Ibaraki (JP)

(72) Inventor: Motohiro Nakahara, Ibaraki (JP)

(73) Assignee: NAKAHARA OPTO-ELECTRONICS LABORATORIES, INC., Ibaraki (JP)

(*) Notice: Subject to any disclaimer, the term of this patent is extended or adjusted under 35 U.S.C. 154(b) by 362 days.

(21) Appl. No.: 15/565,684

(22) PCT Filed: Apr. 13, 2016

(86) PCT No.: PCT/JP2016/061885
§ 371 (c)(1),
(2) Date: Oct. 11, 2017

(87) PCT Pub. No.: WO2016/167273
PCT Pub. Date: Oct. 20, 2016

(65) Prior Publication Data
US 2018/0079676 A1 Mar. 22, 2018

(30) Foreign Application Priority Data

Apr. 15, 2015 (JP) .............................. JP2015-083035

(51) Int. Cl.
*C03B 23/047* (2006.01)
*G02B 6/44* (2006.01)
(Continued)

(52) U.S. Cl.
CPC ............ *C03B 23/047* (2013.01); *C03B 23/13* (2013.01); *C03B 23/207* (2013.01); *G01R 33/58* (2013.01);
(Continued)

(58) Field of Classification Search
CPC ................ C03B 23/047; C03B 37/012; C03B 37/01205; C03B 37/01208;
(Continued)

(56) References Cited

U.S. PATENT DOCUMENTS

2003/0231846 A1* 12/2003 Fajardo ............... C03B 37/0122
385/125
2004/0096173 A1* 5/2004 Fekety .................. B82Y 20/00
385/125
(Continued)

FOREIGN PATENT DOCUMENTS

JP 57-58105 A 4/1982
JP 2007-72251 A 3/2007
(Continued)

OTHER PUBLICATIONS

International Search Report dated May 31, 2016 from corresponding PCT International Application PCT/JP2016/061885, 2 pages.
(Continued)

*Primary Examiner* — Lee E Sanderson
*Assistant Examiner* — Michael C Romanowski
(74) *Attorney, Agent, or Firm* — Ohlandt, Greeley, Ruggiero & Perle, L.L.P.

(57) ABSTRACT

A perforated quartz glass tube includes a jacket tube containing a quartz glass material, a plurality of cylindrical glass tubes which are inserted into a pore region of the jacket tube along an axial direction of the jacket tube, and contain a quartz glass material having a softening point higher than a softening point of the jacket tube, and a gap member which is inserted into a gap between the cylindrical glass tubes and a gap between the jacket tube and the cylindrical glass tube, and contains a quartz glass material having a softening point lower than a softening point of the cylindrical glass tube.

5 Claims, 4 Drawing Sheets

(51) Int. Cl.
    *C03B 23/13*    (2006.01)
    *G01R 33/58*    (2006.01)
    *C03B 23/207*   (2006.01)
    *G02B 6/36*     (2006.01)
    *C03B 37/012*   (2006.01)

(52) U.S. Cl.
    CPC ........ *G02B 6/443* (2013.01); *C03B 37/01245* (2013.01); *C03B 2201/04* (2013.01); *C03B 2201/23* (2013.01); *G02B 6/3644* (2013.01)

(58) Field of Classification Search
    CPC ......... C03B 37/01211; C03B 37/01214; C03B 37/01217; C03B 37/0122; C03B 37/01222; G02B 6/02; G02B 6/02042; G02B 6/02347; G02B 6/028; G02B 6/036; G02B 6/10; G02B 6/02309–02347; G02B 2006/12038; G02B 6/44
    USPC ............................ 385/123–126; 65/105, 393
    See application file for complete search history.

(56) References Cited

U.S. PATENT DOCUMENTS

| | | | | |
|---|---|---|---|---|
| 2004/0258381 | A1* | 12/2004 | Borrelli | B23K 26/064 385/125 |
| 2006/0153512 | A1* | 7/2006 | Falkenstein | C03B 37/0122 385/125 |
| 2014/0216109 | A1 | 8/2014 | Ishida et al. | |

FOREIGN PATENT DOCUMENTS

| | | |
|---|---|---|
| JP | 2014-152045 A | 8/2014 |
| JP | 2015-45705 A | 3/2015 |

OTHER PUBLICATIONS

International Preliminary Report on Patentability dated Oct. 26, 2017 from corresponding PCT International Application PCT/JP2016/061885, 5 pages.

* cited by examiner

PERFORATED QUARTZ GLASS TUBE AND METHOD FOR MANUFACTURING PERFORATED QUARTZ GLASS TUBE

BACKGROUND

1. Field of the Disclosure

The present disclosure relates to a perforated quartz glass tube and a method for manufacturing a perforated quartz glass tube.

2. Discussion of the Background Art

In accordance with the improvement of processing technology, perforated glass tubes having a plurality of pores are able to be manufactured from a base material of glass, and perforated glass tubes into which optical fibers are inserted are used as optical components of optical information communication. Perforated glass tubes are formed by drilling plural pores in the axial direction of base material and by heat-elongating the same in the furnace.

A plurality of pore portions of the perforated glass tube are formed by piercing the base material by using a drill such as electrodeposited diamond set to a certain feed speed and a certain number of revolutions in the piercing step. At the drilling pores step for piercing the base material, the pore position is determined by taking the tolerable displacement amount of the pore portion into consideration.

Technical Problem

In the step of drilling a pore portion, there occurs pore displacement caused by bending and vibration of the drill in the case of piercing tool. In such a case, in the perforated glass tube according to the related art, the deterioration of straightness and linearity with respect to the piercing direction and roundness of the pore portion is caused by the displacement amount of the pore portion, and the accuracy suitable for practical use cannot be thus secured.

In addition, when the pores number and the pores density increase, problems have been expected such that the interval between the respective pores narrows, the wall breaks, and the like. In particular, when the interval between the pores is as thin as 1 mm or less at the stage of pierced preform, the occurrence of breaking becomes remarkable and there has been limitation on the number of pores, the size and disposition of pores, and the like.

The perforated glass tube according to the related art is manufactured by using quartz glass and multicomponent glass as a glass material. However, the multicomponent glass cannot be used in high purity silicon process. In the semiconductor manufacturing process, since the multicomponent glass contains more impurities as compared to quartz glass. In addition, in the multicomponent glass, the softening point thereof is, for example, about 730° C. or lower, and thus the multicomponent glass cannot be used in an environment at a high temperature exceeding 1000° C., and the like.

SUMMARY

In order to solve the above problems, the present disclosure is aimed to provide a perforated quartz glass tube in which a fixing member is inserted into a gap among a plurality of aligned quartz glass tubes, and the plurality of aligned quartz glass tubes and the fixing member are surrounded by a quartz glass tube for outer frame.

Solution to Problem

In order to achieve the above object, present disclosure, a base material is fabricated by using a plurality of quartz glass tubes, a fixing member, and a quartz glass tube for outer frame which contain quartz glass materials having different softening points from one another.

Specifically, a perforated quartz glass tube according to the present disclosure includes: a jacket tube containing a quartz glass material; a plurality of cylindrical glass tubes which is inserted into a pore region of the jacket tube along an axial direction of the jacket tube, and where the plurality of cylindrical glass tubes contains a quartz glass material having a softening point higher than a softening point of the jacket tube; and a gap member which is inserted into a gap between the cylindrical glass tubes and a gap between the jacket tube and the cylindrical glass tube, and where the gap member contains a quartz glass material having a softening point lower than a softening point of the cylindrical glass tube.

In the perforated quartz glass tube according to the present disclosure, the jacket tube and the gap member may contain more hydroxyl groups than the cylindrical glass tube.

In the perforated quartz glass tube according to the present disclosure, the jacket tube and the gap member may be formed of a flame fused quartz glass material, and the cylindrical glass tube may be formed of an electrically fused quartz glass material.

In the perforated quartz glass tube according to the present disclosure, the jacket tube may have a square, hexagonal, or circular cross section perpendicular to an axial direction of the jacket tube.

Specifically, a method for manufacturing a perforated quartz glass tube according to the present disclosure includes: an insertion step of inserting a plurality of cylindrical glass tubes which contains a quartz glass material having a softening point higher than a softening point of a jacket tube into a pore region of the jacket tube containing a quartz glass material along an axial direction of the jacket tube, and inserting a gap member which contains a quartz glass material having a softening point lower than a softening point of the cylindrical glass tube into a gap between the cylindrical glass tubes and a gap between the jacket tube and the cylindrical glass tube; and a thermal fusion step of heating and fusing the jacket tube into which the cylindrical glass tube and the gap member are inserted in a temperature zone higher than softening points of the jacket tube and the gap member and lower than a softening point of the cylindrical glass tube.

Incidentally, the above respective disclosures can be combined as much as possible.

Advantageous Effects of Invention

According to the present disclosure, it is possible to provide a perforated quartz glass tube in which a fixing member is inserted into a gap among a plurality of aligned quartz glass tubes and the plurality of aligned quartz glass tubes and the fixing member are surrounded by a quartz glass tube for outer frame.

DETAILED DESCRIPTION OF THE PREFERRED EMBODIMENT

Figure 1:
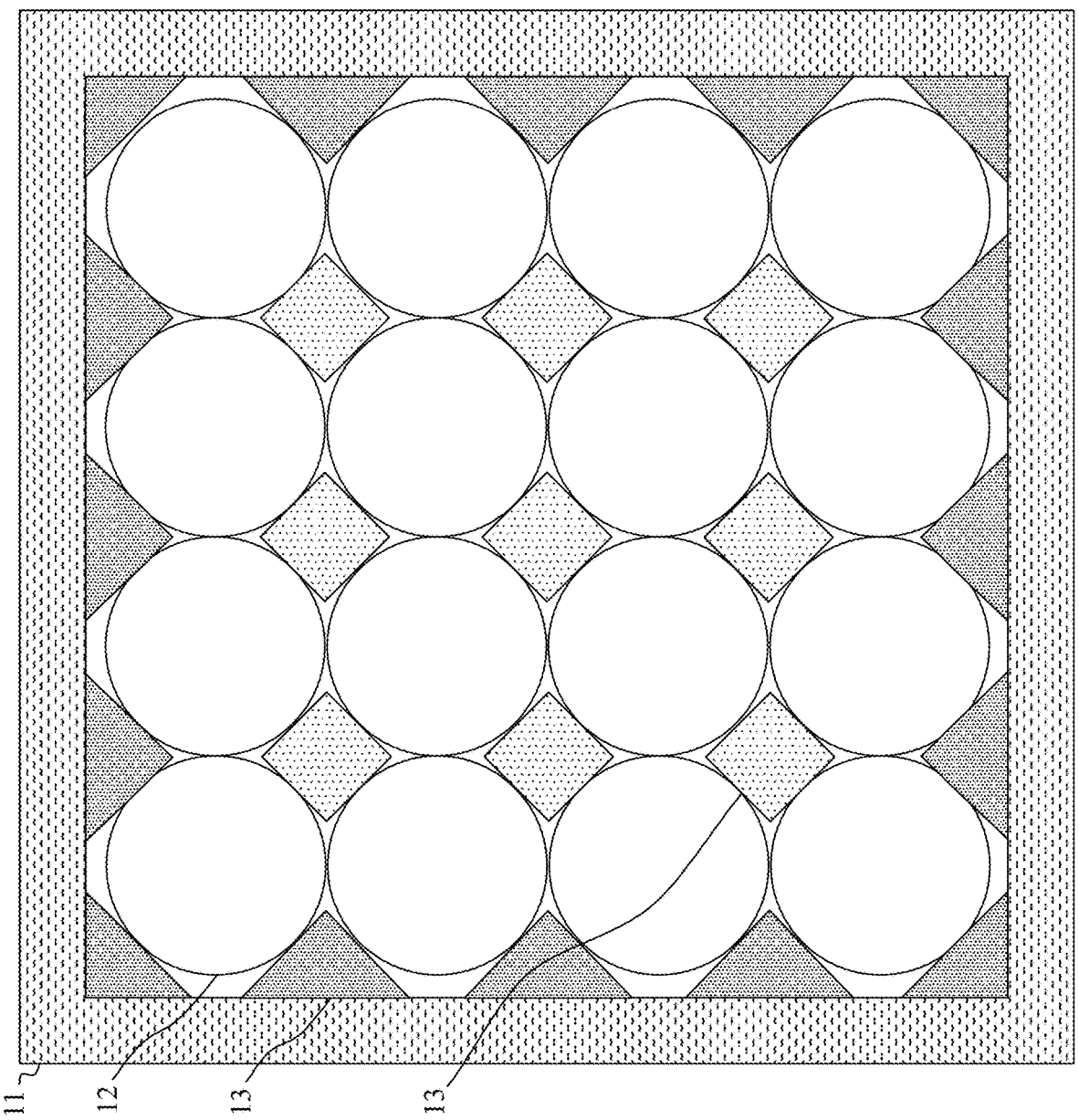
FIG. 1 illustrates an example of a cross-sectional view of a perforated quartz glass tube according to the present embodiment.

Hereinafter, embodiments of the present disclosure will be described in detail with reference to the drawings. Incidentally, the present disclosure is not limited to the embodiments to be described below. The following embodiments are examples, and the present disclosure can be implemented in various modified and improved forms based on knowledge of those skilled in the art. Incidentally, constituent elements having the same reference numerals in this specification and the drawings are to be mutually identical.

EMBODIMENT 1

As illustrated in FIG. 1, the perforated quartz glass tube according to the present embodiment is manufactured by drawing a base material composed of a jacket tube 11, a cylindrical glass tube 12, and a gap member 13. The jacket tube 11 is a rectangular glass material which is capable of accommodating a plurality of cylindrical glass tubes 12 and the gap member 13 and elongated in the longitudinal direction. In the cylindrical glass tube 12 and the gap member 13 which are accommodated inside the jacket tube 11, the plurality of cylindrical glass tubes 12 are disposed along the axial direction of the jacket tube 11 and the gap member 13 is disposed in the gap between the cylindrical glass tubes 12 and gap between the cylindrical glass tube 12 and the jacket tube 11.

In FIG. 1, a base material of the perforated quartz glass tube according to the present embodiment in which the plurality of cylindrical glass tubes 12 and the gap member 13 are accommodated in the square jacket tube 11 is illustrated. The plurality of cylindrical glass tubes 12 to be disposed on the inner peripheral side of the jacket tube 11 are disposed in an array shape. The gap member 13 formed into a desired shape is inserted into the gap among the plurality of cylindrical glass tubes 12 disposed in an array shape. In this case, because the cylindrical glass tube 12 has a circular shape, thus a gap is thus formed when the gap member 13 inserted into a polygonal shape is inserted therebetween.

Then, in the present embodiment, a base material composed of the jacket tube 11, the gap member 13, and the cylindrical glass tube 12 which use glass materials having different softening points by thermal fusion is formed. Specifically, high OH-containing quartz glass materials containing a hydroxyl group (OH group) is used for the jacket tube 11 and the gap member 13, and an electrically fused quartz glass material having a softening point higher than that of the high OH-containing quartz glass materials by 100° C. is used for the cylindrical glass tube 12.

The content of OH group in the high OH-containing quartz glass materials is, for example, 100 ppm or more and 1000 ppm or less. As the high OH-containing quartz glass materials, it is possible to use a flame fused quartz glass material capable of being flame fused. As the electrically fused quartz glass material, it is possible to use, for example, a low OH-containing quartz glass material having a content of OH group of 20 ppm or less. The softening points of the jacket tube 11 and the gap member 13 are, for example, 1590° C. and the softening point of the cylindrical glass tube 12 is, for example, 1680° C.

Figure 2:
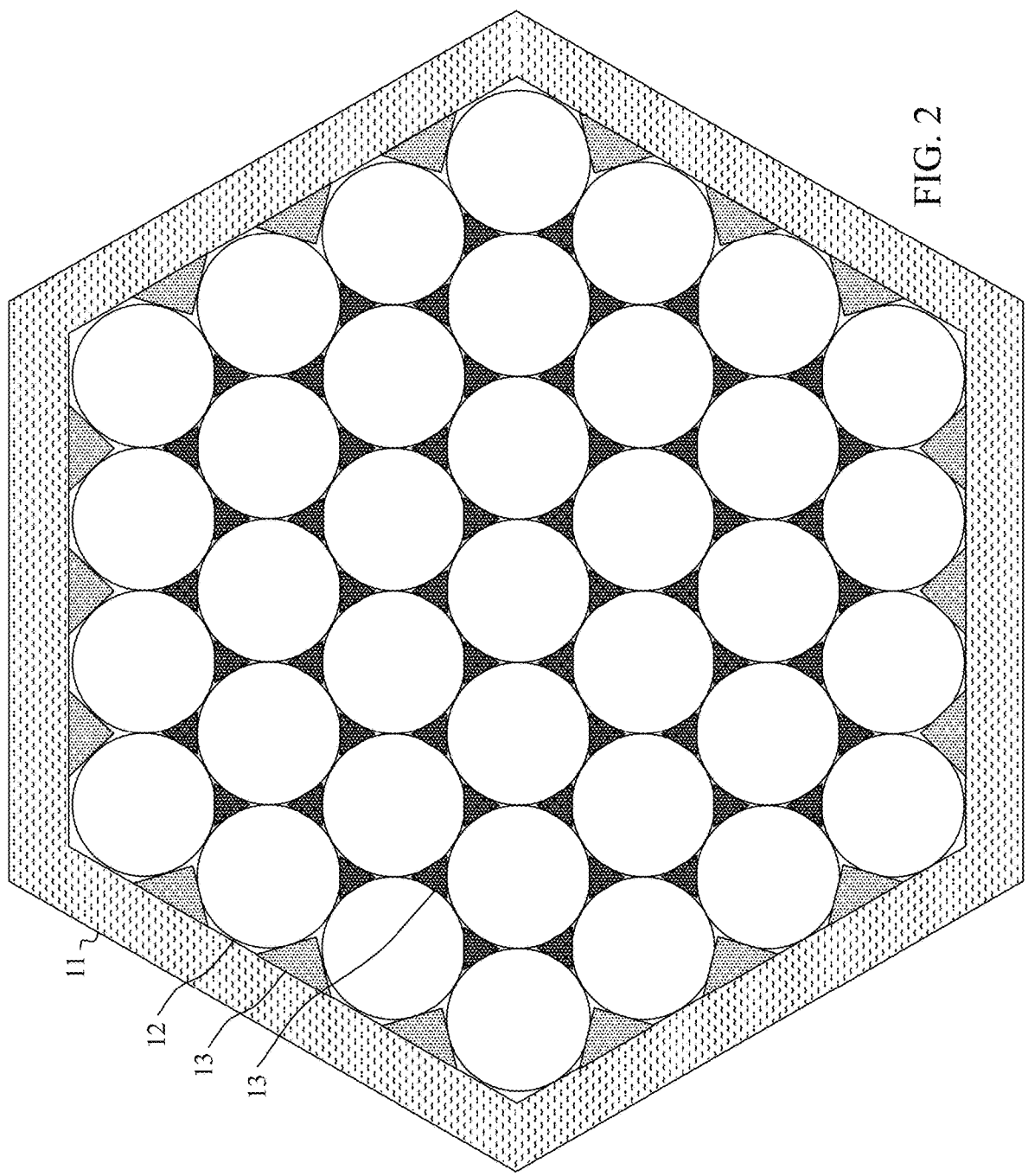
FIG. 2 illustrates an example of a cross-sectional view of a perforated quartz glass tube according to the Present embodiment.

By drawing the base material composed of the jacket tube 11, the gap member 13, and the cylindrical glass tube 12 made of glass materials having different softening points by hot drawing in an inert gas atmosphere or the like, it is possible to fill the high OH-containing quartz glass material having a low softening point in the gap in the jacket tube 11 in which the cylindrical glass tube 12 and the gap member 13 are disposed. Incidentally, as illustrated in FIG. 2, one in which the plurality of cylindrical glass tubes 12 and the gap member 13 are accommodated in the hexagonal jacket tube 11 may be used as the base material of the perforated quartz glass tube according to the present embodiment. In addition, the jacket tube 11 may be a cylindrical jacket tube having a circular cross section perpendicular to the axial direction of the jacket tube.

The perforated quartz glass tube according to the present embodiment is manufactured by a manufacturing method including an insertion step and a thermal fusion step. In the inserting step, the cylindrical glass tube 12 and the gap member 13 are inserted into the pore region of the jacket tube 11 along the axial direction of the jacket tube 11. In the thermal fusion step, the jacket tube 11 into which the cylindrical glass tube 12 and the gap member 13 are inserted is heated and fused in a temperature zone which is higher than the softening point of the jacket tube 11 and the gap member 13, besides the temperature zone is lower than the softening point of the cylindrical glass tube 12.

As described above, the base material formed of the jacket tube 11, the gap member 13, and the cylindrical glass tube 12 made of glass materials having different softening points by thermal fusion is used, and thus a step of piercing a pore portion by using a drill is not required, the deterioration of straightness, linearity, and roundness of the pore portion caused by the displacement amount of the pore portion due to bending of the drill and the amplitude of vibration can be prevented, contamination of the base material by the glass scraps generated by piercing is prevented, and the step of removing the glass scraps is also not required.

In addition, the base material of the perforated quartz glass tube according to the present embodiment is composed by only inserting the gap member 13 and the cylindrical glass tube 12 into the jacket tube 11, and thus the length of the base material in the axial direction, which is limited by the performance of the drill itself is not limited by the performance of the processing machine and it is possible to fabricate a base material of an elongated perforated quartz glass tube.

The perforated quartz glass tube according to the present embodiment has a plurality of pore portions, and it is thus possible to enclose the optical fiber with the pore portion so as to be protected, and the end faces of the enclosed optical fibers may be brought into contact with each other and connect to use the perforated quartz glass tube as an optical connector. As a manufacturing method in the case of using the perforated quartz glass tube as an optical connector includes the following steps. The cylindrical glass tube 12 is disposed for inserting an optical fiber. The base material in other word, a preform is formed by disposing the cylindrical glass tube 12 and the gap member 13 in the jacket tube 11. Then the preform is hot drawn.

Figure 3:
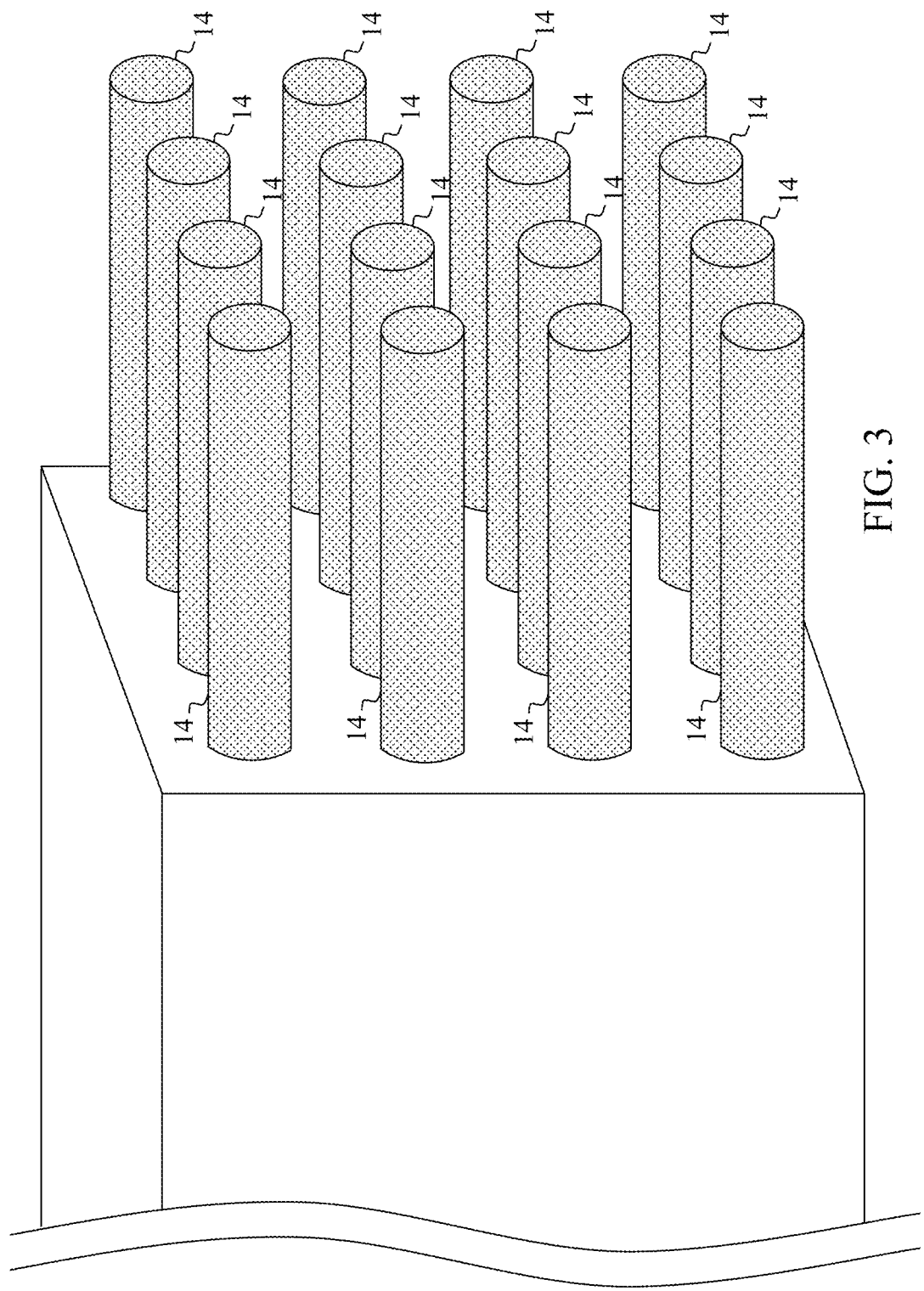
FIG. 3 illustrates an example of a configuration view of a perforated quartz glass tube in which a cylindrical glass tube is inserted into a pore portion according to the present embodiment.

As illustrated in FIG. 3, the optical fiber 14 is inserted into the pore portion formed on the cylindrical glass tube 12 and fixed by using an adhesive. In the case of using as an optical connector, the end face of the perforated quartz glass tube holding the optical fiber is polished to prevent optical loss due to protrusion or burial of the optical fiber. In addition, as the cross-sectional shape of the perforated quartz glass tube according to the present embodiment illustrated in FIGS. 1 and 2, the polygonal jacket tube 11 is exemplified. The rotation around the axis is restricted by forming the jacket tube 11 into a polygonal shape, and it is thus possible to easily connect the optical axes of the optical fibers to each other in the case of using them as a capillary for multicore fiber.

Figure 4:
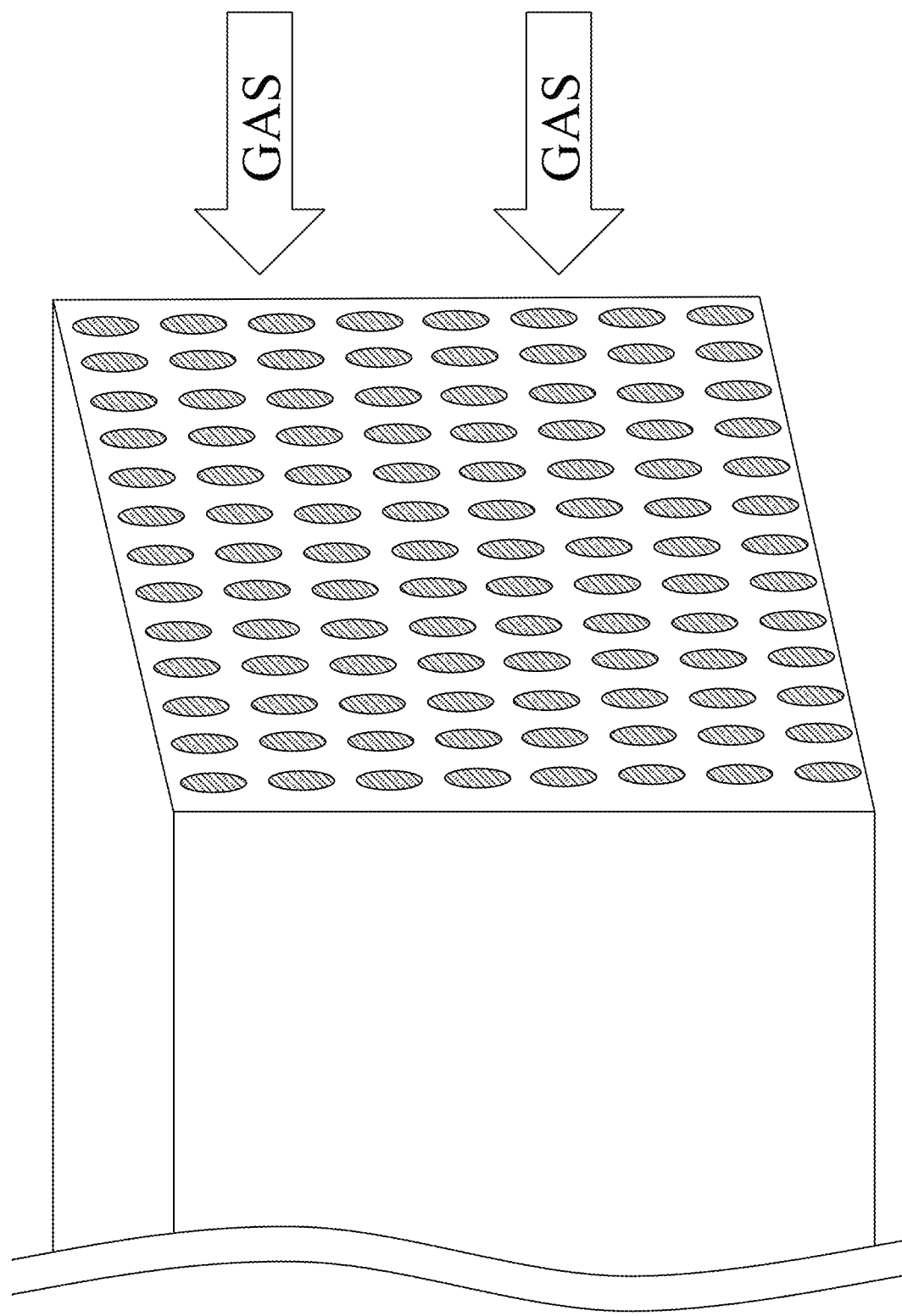
FIG. 4 illustrates an example of a configuration view of a perforated quartz glass tube having a fine pore portion according to the present embodiment.

The perforated quartz glass tube according to the present disclosure can also be used as a semiconductor device since it uses quartz glass of a high purity glass component as the material without using multicomponent glass. In the field of air conditioning facility, as illustrated in FIG. 4, the perforated quartz glass tube can be used as a gas filter for adsorbing or passing a molecular component having a size equal to or smaller than a certain size by only hot drawing the base material into which the fine cylindrical glass tube 12 is inserted. As a manufacturing procedure in the case of using the perforated quartz glass tube as a gas filter, the fine cylindrical glass tube 12 for adsorbing or passing a molecular component having a size equal to or smaller than a certain size and the gap member 13 are disposed in the jacket tube 11 and the base material in which the cylindrical glass tube 12 and the gap member 13 are disposed in the jacket tube 11 is hot drawn.

In addition, in the field of medical device industry, an MRI (Magnetic Resonance Imaging) image tensor is obtained by allowing a copper sulfate solution to flow into the glass tube and taking out a nuclear magnetic resonance signal from the copper sulfate solution flowed in the glass tube by using the perforated quartz glass tube according to the present embodiment but without using multicomponent glass containing a large amount of a magnetic component. Meanwhile, the inner diameter of the tube is a known value measured in advance, and it is thus possible to determine the inner diameter of the blood vessel by comparing the known value to the reaction diameter from the blood vessel for test measurement displayed on the MRI image. Therefore, the perforated quartz glass tube of the present disclosure can be used as a standard model of the inner diameter of the blood vessel. Consequently, the perforated quartz glass tube can be applied to a medical subject as a blood vessel model of a gauge in an MRI apparatus.

INDUSTRIAL APPLICABILITY

The present disclosure can be applied to the information communication industry, the air conditioning industry, and the medical device industry.

REFERENCE SIGNS LIST

11: Jacket tube
12: Cylindrical glass tube
13: Gap member
14: Optical fiber

What is claimed is:

1. A gas filter including a perforated quartz glass tube comprising:
    a jacket tube formed of a flame fused quartz glass material that is a high purity glass component that does not include multicomponent glass and magnetic components, where the flame fused quartz glass material contains a hydroxyl group content of 100 ppm or more;
    a plurality of cylindrical glass tubes which are inserted into a pore region of the jacket tube along an axial direction of the jacket tube, wherein the plurality of cylindrical glass tubes are formed of an electrically fused quartz glass material that is a high purity glass component that does not include multicomponent glass and magnetic components, where the electrically fused quartz glass material contains a hydroxyl group content of 20 ppm or less and has a softening point temperature higher than a softening point temperature of the flame fused quartz glass material of the jacket tube; wherein the plurality of cylindrical glass tubes adsorb or pass molecules of a predetermined size or less; and
    a plurality of gap members which are inserted into gaps between the cylindrical glass tubes and gaps between the jacket tube and the cylindrical glass tubes, wherein the plurality of gap members are formed of a flame fused quartz glass material that is a high purity glass component that does not include multicomponent glass and magnetic components, where the flame fused quartz glass material of the plurality of gap members contains a hydroxyl group content of 100 ppm or more and has a softening point temperature lower than the softening point temperature of the electrically fused quartz glass material of the cylindrical glass tubes.

2. The gas filter including a perforated quartz glass tube according to claim 1, wherein the jacket tube has a polygonal cross section perpendicular to an axial direction of the jacket tube.

3. A perforated quartz glass tube comprising:
    a jacket tube formed of a flame fused quartz glass material that is a high purity glass component that does not include multicomponent glass and magnetic components, where the flame fused quartz glass material contains a hydroxyl group content of 100 ppm or more;
    a plurality of cylindrical glass tubes which are inserted into a pore region of the jacket tube along an axial direction of the jacket tube, wherein the plurality of cylindrical glass tubes are formed of an electrically fused quartz glass material that is a high purity glass component that does not include multicomponent glass and magnetic components, where the electrically fused quartz glass material contains a hydroxyl group content of 20 ppm or less and has a softening point temperature higher than a softening point temperature of the flame fused quartz glass material of the jacket tube; and
    a plurality of gap members which are inserted into gaps between the cylindrical glass tubes and gaps between the jacket tube and the cylindrical glass tubes, wherein the plurality of gap members are formed of a flame fused quartz glass material that is a high purity glass component that does not include multicomponent glass and magnetic components, where the flame fused quartz glass material of the plurality of gap members contains a hydroxyl group content of 100 ppm or more and has a softening point temperature lower than the softening point temperature of the electrically fused quartz glass material of the cylindrical glass tubes.

4. A method of manufacturing a perforated quartz glass tube, the method comprising:
    an insertion step of inserting a plurality of cylindrical glass tubes formed of an electrically fused quartz glass material that is a high purity glass component that does not include multicomponent glass and magnetic components, where the electrically fused quartz glass contains a hydroxyl group content of 20 ppm or less, into a pore region of a jacket tube along an axial direction;

where the jacket tube is formed of a flame fused quartz glass material that is a high purity glass component that does not include multicomponent glass and magnetic components, where the flame fused quartz glass material contains a hydroxyl group content of 100 ppm or more; and where the electrically fused quartz glass material of the cylindrical glass tubes has a softening point temperature higher than a softening point temperature of the flame fused quartz glass material of the jacket tube;

and inserting a plurality of gap members formed of a flame fused quartz glass material that is a high purity glass component that does not include multicomponent glass and magnetic components, where the flame fused quartz glass material of the plurality of gap members contains a hydroxyl group content of 100 ppm or more and has a softening point temperature lower than the softening point temperature of the electrically fused quartz glass material of the cylindrical glass tubes, into gaps between the plurality of cylindrical glass tubes and gaps between the jacket tube and the plurality of cylindrical glass tubes; and a thermal fusion step of heating and fusing the jacket tube into which the plurality of cylindrical glass tubes and the plurality of gap members have been inserted in a temperature zone which is higher than the softening points of the flame fused quartz glass materials of the jacket tube and the plurality of gap members.

5. The method of manufacturing the perforated quartz glass tube according to claim 4, wherein the jacket tube has a polygonal cross section perpendicular to an axial direction of the jacket tube.

* * * * *